United States Patent
Kajiyama

(10) Patent No.: US 10,411,076 B2
(45) Date of Patent: Sep. 10, 2019

(54) EL DISPLAY DEVICE

(71) Applicant: Japan Display Inc., Minato-ku, Tokyo (JP)

(72) Inventor: Kenta Kajiyama, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/822,814

(22) Filed: Nov. 27, 2017

(65) Prior Publication Data

US 2018/0151637 A1    May 31, 2018

(30) Foreign Application Priority Data

Nov. 29, 2016   (JP) ................. 2016-231113

(51) Int. Cl.
*H01L 27/32* (2006.01)
*H01L 51/50* (2006.01)
*H01L 51/52* (2006.01)

(52) U.S. Cl.
CPC ...... *H01L 27/3218* (2013.01); *H01L 27/3216* (2013.01); *H01L 27/3246* (2013.01); *H01L 51/5012* (2013.01); *H01L 51/524* (2013.01)

(58) Field of Classification Search
None
See application file for complete search history.

(56) References Cited

U.S. PATENT DOCUMENTS

| | | |
|---|---|---|
| 8,994,015 B2 | 3/2015 | Pyon et al. |
| 2012/0313844 A1* | 12/2012 | Im ............... H01L 27/3216 345/76 |
| 2015/0162391 A1 | 6/2015 | Kim |
| 2015/0200237 A1 | 7/2015 | Yim et al. |
| 2015/0287767 A1* | 10/2015 | Lee ............... H01L 27/3216 257/40 |
| 2016/0351116 A1* | 12/2016 | Sun ............... H01L 27/3218 |
| 2017/0069664 A1* | 3/2017 | Nakamura ......... H01L 27/124 |
| 2017/0352710 A1* | 12/2017 | Hong ............... H01L 27/3218 |

* cited by examiner

*Primary Examiner* — Walter H Swanson
*Assistant Examiner* — Kien C Ly
(74) *Attorney, Agent, or Firm* — Oblon, McClelland, Maier & Neustadt, L.L.P.

(57) ABSTRACT

An organic EL display device includes a plurality of pixels including first pixels and second pixels. Each of the plurality of pixels includes a red sub-pixel including a red light emitting area emitting red light, a green sub-pixel including a green light emitting area emitting green light, and a blue sub-pixel including a blue light emitting area emitting blue light. The blue sub-pixel included in the first pixel is provided with a spacer at a portion of an area corresponding to the blue light emitting area included in the second pixel.

5 Claims, 7 Drawing Sheets

EL DISPLAY DEVICE

CROSS-REFERENCE TO RELATED APPLICATION

The present application claims priority from Japanese Application JP2016-231113 filed on Nov. 29, 2016, the content of which is hereby incorporated by reference into this application.

BACK GROUND OF THE INVENTION

1. Field of the Invention

The present invention relates to an organic EL display device.

2. Description of the Related Art

A known technique for manufacturing organic EL display devices is to form organic EL elements in turn for each luminescent color by using a vapor deposition mask. In the process of forming the organic EL element, a spacer 310 may be disposed on a display area to provide a space between the vapor deposition mask and the organic EL element so as not to damage the organic EL element by, for example, a foreign substance attached to the vapor deposition mask.

For example, referring to FIG. 7A and FIG. 7B, the organic EL display device having the spacer 310 will be described. FIG. 7A is a plan view of pixels 700 of the organic EL display device according to the conventional technique. As shown in FIG. 7A, a pixel 700 includes a red light emitting area 304 emitting red light, a green light emitting area 306 emitting green light, and a blue light emitting area 308 emitting blue light. Spacers 310 are disposed between the light emitting areas so as to provide a space between the vapor deposition mask 702 and the organic EL elements.

FIG. 7B is a cross-sectional view of FIG. 7A taken along the line VII-VII, showing the vapor deposition mask 702 being disposed when the organic EL elements are formed. As shown in FIG. 7B, each light emitting area has an anode electrode. Between the anode electrodes, ribs 410, which are higher than the anode electrodes, and the spacers 310 are provided.

The spacers 310 provide a space between the organic EL element on the anode electrode and the vapor deposition mask 702. As such, even if a foreign substance 704 adheres to the vapor deposition mask 702, it is possible to prevent the foreign substance 704 from being in contact with the organic EL element (red organic EL element 412 in FIG. 7B) and damaging the organic EL element.

The conventional technique for providing the spacer is disclosed in, for example, U.S. Pat. No. 8,994,015, in which spacers are disposed around a blue light emitting area on an organic EL display device having light emitting areas respectively emitting light in red, green, and blue.

Further, U.S. Patent Publication Nos. 2015/0162391 and 2015/0200237 disclose an organic EL display device having light emitting areas emitting red, green, and blue light, in which spacers are disposed between non-light emitting areas between the light emitting areas.

SUMMARY OF THE INVENTION

In the conventional technique, a spacer can be disposed on a non-light emitting area of a pixel as described in U.S. Pat. No. 8,994,015, Patent Publication Nos. 2015/0162391 and 2015/0200237 because a size of a pixel is large. However, along with improving resolution of display devices, a size of a pixel is reduced, and this results in difficulty in disposing spacers in the non-light emitting area.

In this case, a size of the light emitting area is reduced due to the spacers disposed in the light emitting area. When the size of the light emitting area is smaller, brightness is reduced. If electric current through the organic EL element is increased so as to compensate such decrease in brightness, lifetime of the display device will be shortened.

One or more embodiments of the present invention have been conceived in view of the above, and an object thereof is to provide an organic EL display device in which a spacer is disposed in a blue light emitting area having less effect on visibility in order to reduce deterioration of display quality due to the spacer, even if the spacer is disposed in the light emitting area in high definition.

According to one aspect of the present invention, an organic EL display device includes a plurality of pixels including first pixels and second pixels. Each of the plurality of pixels includes a red sub-pixel including a red light emitting area emitting red light, a green sub-pixel including a green light emitting area emitting green light, and a blue sub-pixel including a blue light emitting area emitting blue light. The blue sub-pixel included in the first pixel is provided with a spacer at a portion of an area corresponding to the blue light emitting area included in the second pixel.

In one embodiment of the present invention, the plurality of pixels are respectively disposed in a first direction and a second direction perpendicular to the first direction, and the first pixels and the second pixels are alternately disposed in the first direction and the second direction.

In one embodiment of the present invention, the plurality of pixels are respectively disposed in the first direction and the second direction perpendicular to the first direction. Each of the pixels arranged n-th position in the second direction is displaced by ½ a width of the pixel in the first direction from each of the pixels arranged n+1-th position in the second direction. Pixels arranged n-th position in the second direction include the first pixels and the second pixels that are alternately disposed in the first direction. Pixels arranged n+1-th position in the second direction include the second pixels disposed side by side in the first direction.

In one embodiment of the present invention, the plurality of pixels are respectively disposed in the first direction and the second direction perpendicular to the first direction. The first pixels and the second pixels are alternately disposed in the first direction and the second direction. In each of the pixels, the blue sub-pixel is disposed in the first direction side of the red sub-pixel and the green sub-pixel, and the green sub-pixel is disposed in the second direction side of the red sub-pixel. Each blue light emitting area included in the first pixels and the second pixels is larger than the red light emitting area and the green light emitting area.

DETAILED DESCRIPTION OF THE INVENTION

An embodiment of the present invention will be described below in detail with reference to the accompanying drawings. The accompanying drawings schematically illustrate widths, thicknesses, shapes, or other characteristics of each part for clarity of illustration, compared to actual configurations. However, such a schematic illustration is merely an example and not intended to limit the present invention. In the present specification and drawings, some elements identical or similar to those shown previously are denoted by the same reference signs as the previously shown elements, and thus repetitive detailed descriptions of them may be omitted as appropriate.

Figure 1:
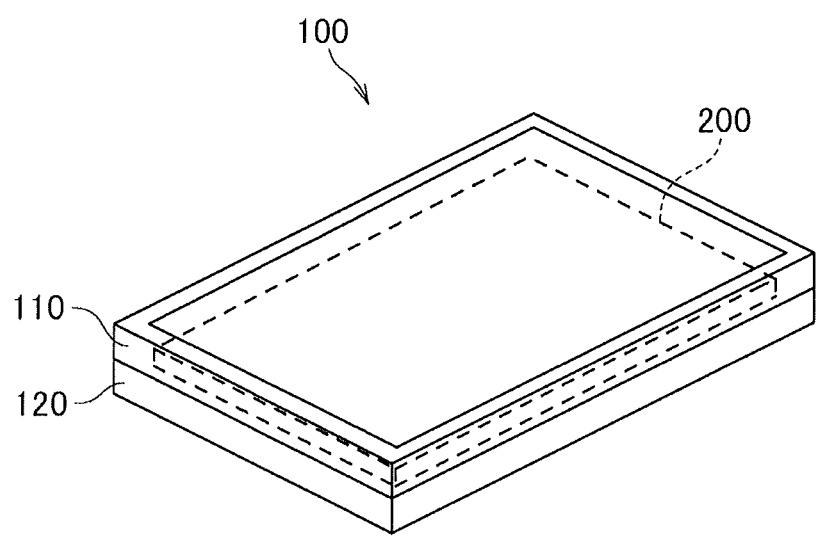
FIG. 1 is a schematic diagram illustrating an organic EL display device according to an embodiment of the present invention.

FIG. 1 is a schematic diagram of an organic EL display device 100 according to an embodiment of the present invention. As shown in FIG. 1, the organic EL display device 100 includes an organic EL panel 200 fixed between an upper frame 110 and a lower frame 120.

Figure 2:
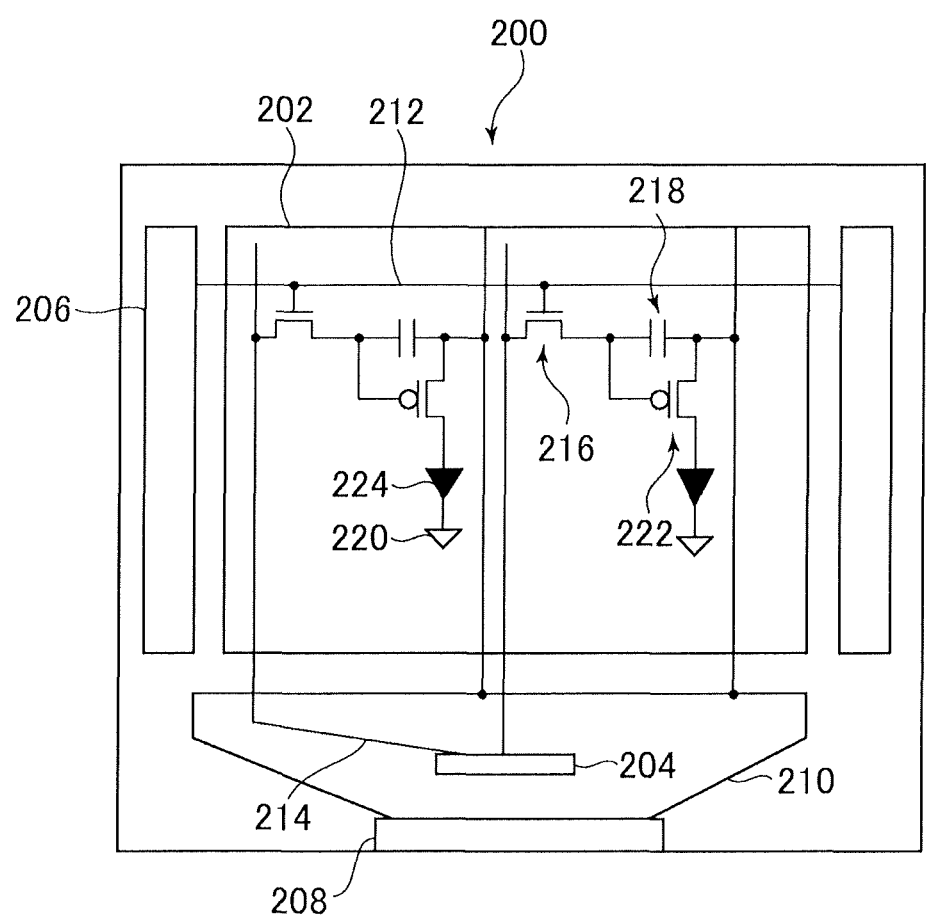
FIG. 2 is a diagram illustrating an organic EL panel viewed from a display side.

FIG. 2 is a schematic diagram showing a configuration of the organic EL panel 200 of FIG. 1. As shown in FIG. 2, the organic EL panel 200 includes a display area 202 for displaying an image based on an image signal supplied from the external of the organic EL panel 200, and a non-display area surrounding the display area 202. The non-display area includes a driver IC 204, a vertical scanning circuit 206, a terminal part 208, a power source line 210, a scanning line 212, and an image signal line 214. The display area 202 includes a power source line 210, a scanning line 212, an image signal line 214, a sampling thin film transistor (TFT) 216, a storage capacitor 218, a cathode electrode 220, a drive TFT 222, and an organic EL element 224.

The driver IC 204 conducts an electrical current corresponding to a gradation value of a pixel to, for example, the image signal line 214. The organic EL panel 200 displays an image composed of multiple pixels on the display area 202 by the driver IC 204.

The terminal part 208 is provided with terminals for supplying power or image signals from the external of the organic EL panel 200. Specifically, metal wiring electrically connected to the driver IC 204 and the power source line 210 are disposed on the terminal part 208. The terminal part 208 are attached to FPCs, for example, and thus power and image signals are supplied to the organic EL panel 200 from the external of the organic EL panel 200 through the FPCs.

The power source line 210 is disposed across the non-display area and the display area 202, and connected to the drive TFT 222 to supply electric currents to the organic EL element 224. Specifically, the power source line 210 is applied with a constant voltage from outside through the FPC. The power source line 210 is electrically connected to a source terminal or a drain terminal of the drive TFT 222, and supplies electric currents to the organic EL element 224 when the drive TFT 222 is in an ON state.

The scanning line 212 is disposed across the non-display area and the display area 202, and connected to a gate terminal of the sampling TFT 216. Specifically, the scanning line 212 electrically connects the vertical scanning circuit 206 to the gate terminal of the sampling TFT 216, and supplies a gate signal obtained from the vertical scanning circuit 206 to the gate terminal of the sampling TFT 216.

The image signal line 214 is disposed across the non-display area and the display area 202, and connected to one of the source terminal and the drain terminal of the sampling TFT 216. Specifically, the image signal line 214 electrically connects the driver IC 204 to one of the source terminal and the drain terminal of the sampling TFT 216, and supplies a voltage corresponding to the image signal from the driver IC 204 to one of the source terminal and the drain terminal of the sampling TFT 216.

The vertical scanning circuit 206 applies potential to a sampling TFT 216 disposed on each pixel to cause a source and a drain thereof to be conductive. Specifically, the vertical scanning circuit 206 generates timing to supply electric currents to an organic EL element 224 on each pixel based on an image signal supplied from outside, and applies potential to the sampling TFT 216 to cause the source and the drain thereof to be conductive in response to the timing.

The sampling TFT 216 controls timing to supply electric currents to the organic EL element 224. Specifically, the sampling TFT 216 supplies the voltage of the image signal line 214 to the storage capacitor 218 in accordance with the voltage of the scanning line 212 supplied to the gate terminal, thereby controlling the timing to supply an image signal voltage to the drive TFT 222.

The storage capacitor 218 holds the voltage supplied from the image signal line 214. Specifically, the storage capacitor 218 becomes the same potential as the voltage of the image signal line 214 while the sampling TFT 216 is in an ON state. Subsequently, the source terminal and the drain terminal of the sampling TFT 216 are electrically disconnected by the voltage of the scanning line 212. The storage capacitor 218 is in a floating state until the sampling TFT 216 enters an ON state next time, and thus holds the voltage supplied from the image signal line 214.

The cathode electrode 220 is electrically connected to the organic EL element 224. Specifically, the cathode electrode 220 is electrically connected to the organic EL element 224, and applied with a voltage between the power source line 210, thereby supplying electric currents to the organic EL element 224.

The drive TFT 222 is connected to the sampling TFT 216, the storage capacitor 218, the power source line 210, and the organic EL element 224. Specifically, the gate terminal of the drive TFT 222 is electrically connected to the source terminal or the drain terminal of the sampling TFT 216 and the storage capacitor 218. One of the source terminal and the drain terminal of the drive TFT 222 is electrically connected to the storage capacitor 218 and the power source line 210. The other one of the source terminal and the drain terminal of the drive TFT 222 is electrically connected to the organic EL element 224. The drive TFT 222 supplies electric currents from the power source line 210 to the organic EL element 224 in accordance with the voltage applied by the storage capacitor 218.

The organic EL element 224 emits light with the electric current supplied by the power source line 210. Specifically, the organic EL element 224 emits light when the electric current, which corresponds to the voltage in the storage capacitor 218, is supplied from the power source line 210 through the drive TFT 222.

[First Embodiment]

Figure 3:
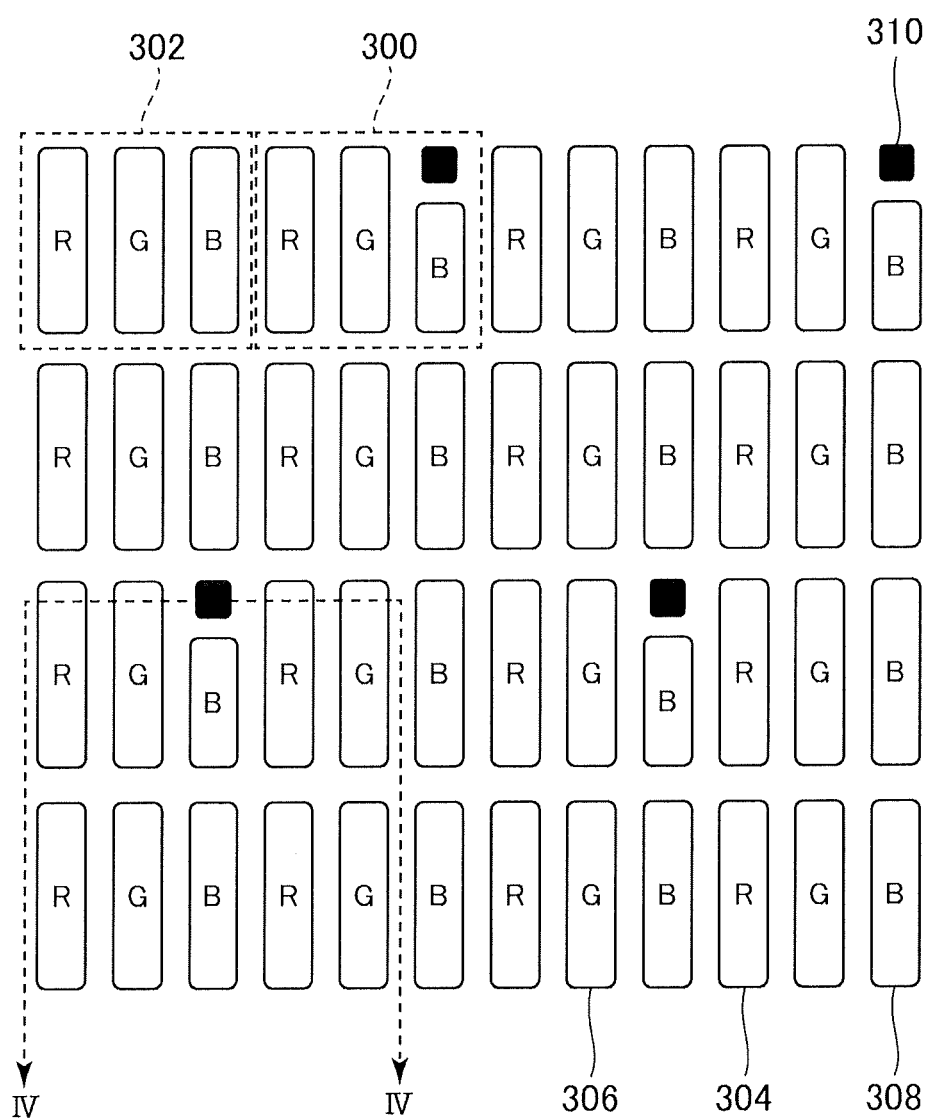
FIG. 3 is a schematic diagram showing an example of a pixel layout in the first embodiment.

Next, pixels formed in the display area 202 will be described. FIG. 3 is a schematic diagram showing an example of a pixel layout in the display area 202 of the first embodiment.

The organic EL display panel of this embodiment includes multiple pixels. Specifically, the organic EL display panel includes, in the display area 202, the pixels comprised of red sub-pixels having the red light emitting area 304 that emits red light, green sub-pixels having the green light emitting area 306 that emits green light, and blue sub-pixels having the blue light emitting area 308 that emits blue light. Each pixel includes a red sub-pixel, a green sub-pixel, and a blue sub-pixel disposed in this order from the left to right in FIG. 3.

The pixels include a first pixel 300 and a second pixel 302. A blue sub-pixel included in the first pixel 300 is provided with a spacer 310 at a part of the area corresponding to the blue light emitting area 308 in the second pixel 302.

Specifically, the blue light emitting area 308 included in the second pixel 302 is of the same area as the red light emitting area 304 included in the first pixel 300 and the green light emitting area 306 included in the second pixel 302. On the other hand, the blue light emitting area 308 included in the first pixel 300 is provided with a spacer 310 at an area corresponding to the upper end part of the blue light emitting area 308 included in the second pixel 302. As such, the blue light emitting area 308 of the first pixel 300 is smaller than the blue light emitting area 308 of the second pixel 302.

The pixels are respectively disposed in a first direction and a second direction perpendicular to the first direction. Specifically, the first pixel 300 with the spacer 310 and the second pixel 302 without the spacer 310 are alternately disposed in a row direction (rightward direction in FIG. 3) and a column direction (downward direction in FIG. 3). The first direction and the second direction are the row direction (rightward direction on the drawing) or the column direction (downward direction on the drawing) of the organic EL panel 200, and either of the first direction and the second direction may be the row direction.

Figure 4:
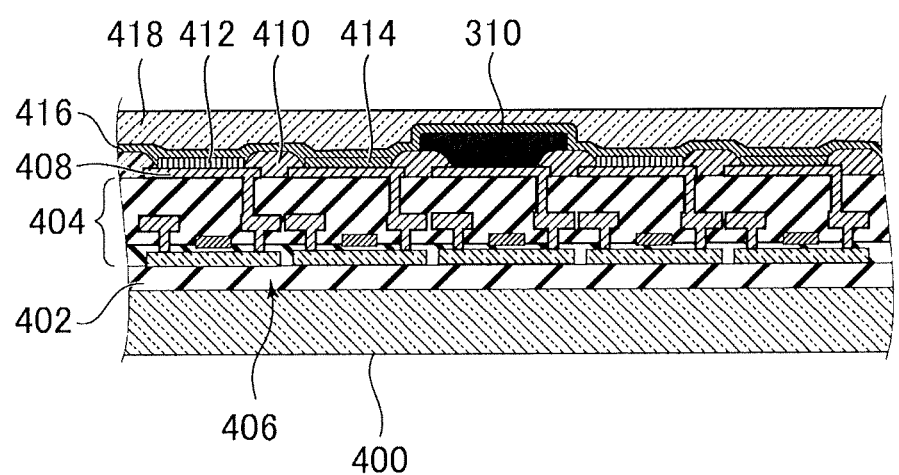
FIG. 4 is a cross-sectional view of the organic EL panel.

Next, a cross-sectional configuration of the area in which the first pixel 300 and the spacer 310 of the second pixel 302 in FIG. 3 are disposed will be described. FIG. 4 is a cross-sectional view of FIG. 3 taken along the line IV-IV.

As shown in FIG. 4, the organic EL panel 200 includes a substrate 400, on which an undercoat layer 402, a TFT circuit layer 404, an anode 408, a rib 410, a red light-emitting layer 412, a green light-emitting layer 414, a cathode 416, a spacer 310, and a sealing film 418 are disposed in this order in the upward direction.

The undercoat layer 402 is made of an insulation material, for example, on the surface of the substrate 400 as a buffer layer of the TFT circuit layer 404.

TFT circuit layer 404 includes a transistor 406 comprised of a source line, a drain line, a gate line, and a semiconductor layer. The transistor 406 is the sampling TFT 216 or the drive TFT 222 shown in FIG. 2. The transistor having the source line connected to the anode as shown in FIG. 4 is the drive TFT 222.

The anode 408 is connected to the source line or the drain line of the drive TFT 222. Specifically, the anode electrode is electrically connected to one of the source line and the drain line of the drive TFT 222, and supplied with electric currents from the power source line 210 through the drive TFT 222.

The rib 410 is formed to cover a peripheral portion of the anode 408. The rib 410 can prevent shorting between the anode 408 and the cathode 416.

The red light-emitting layer 412, the green light-emitting layer 414, and the blue light-emitting layer (not shown) are formed on the anode 408. Specifically, the red light-emitting layer 412, the green light-emitting layer 414, and the blue light-emitting layer are formed by laminating a hole injection layer, a hole transport layer, an organic layer, an electron transport layer, and an electron injection layer. The organic layer emits light when holes injected from the anode 408 and electrons injected from the cathode 416 recombine.

In the cross-sectional view shown in FIG. 4, the spacer 310 is formed in an area where the blue light-emitting layer of the first pixel 300 is formed, and thus the blue light-emitting layer is omitted. However, the blue light-emitting layer is formed on the anode 408 of the blue sub-pixel at a position in the first pixel 300 where the spacer 310 is not formed and in the second pixel 302.

The organic layer included in the red light-emitting layer 412 is made of an organic material that emits red light. Similarly, the organic layer included in the green light-emitting layer 414 and the organic layer included in the blue light-emitting layer are made of organic materials that emits green and blue light, respectively. Since the hole injection layer, the hole transport layer, the electron injection layer, and the electron transport layer are the same as the conventional techniques, the explanation thereof is omitted here.

The spacer 310 is formed on the anode 408. Specifically, the spacer 310 is formed on the anode 408 of the blue sub-pixel included in the first pixel 300, using a material that does not transmit light. When a light-emitting layer is formed by vapor deposition, the spacer 310 keeps a distance between the vapor deposition mask and the vapor deposited light-emitting layer. This prevents the light-emitting layer from being damaged.

The cathode 416 is formed on the rib 410, the spacer 310, the red light-emitting layer 412, the green light-emitting layer 414, and the blue light-emitting layer. Specifically, for example, the cathode 416 is formed of a transparent electrode such as indium tin oxide (ITO) over the rib 410, the spacer 310, and the light-emitting layers, and causes the respective light-emitting layers to emit light by supplying electric currents with the anode.

The sealing film 418 is formed on the cathode 416. The sealing film 418 prevents an element that deteriorates the organic EL element 224, such as moisture, from entering the light-emitting layers.

As described above, even if the spacer 310 is disposed in the light emitting area in high definition, it is possible to reduce deterioration of display quality due to the spacer by disposing the spacer in the blue light emitting area having less effect on visibility.

[Second Embodiment]

The present invention is not limited to the above described embodiment and may be modified in various manners. In the first embodiment, the pixels are disposed in a matrix, but the pixel layout is not limited to this. In the following, second and third embodiments will be described. The cross-sectional configuration of the second and third embodiments is the same as that of the first embodiment, and thus the description thereof will be omitted.

Figure 5:
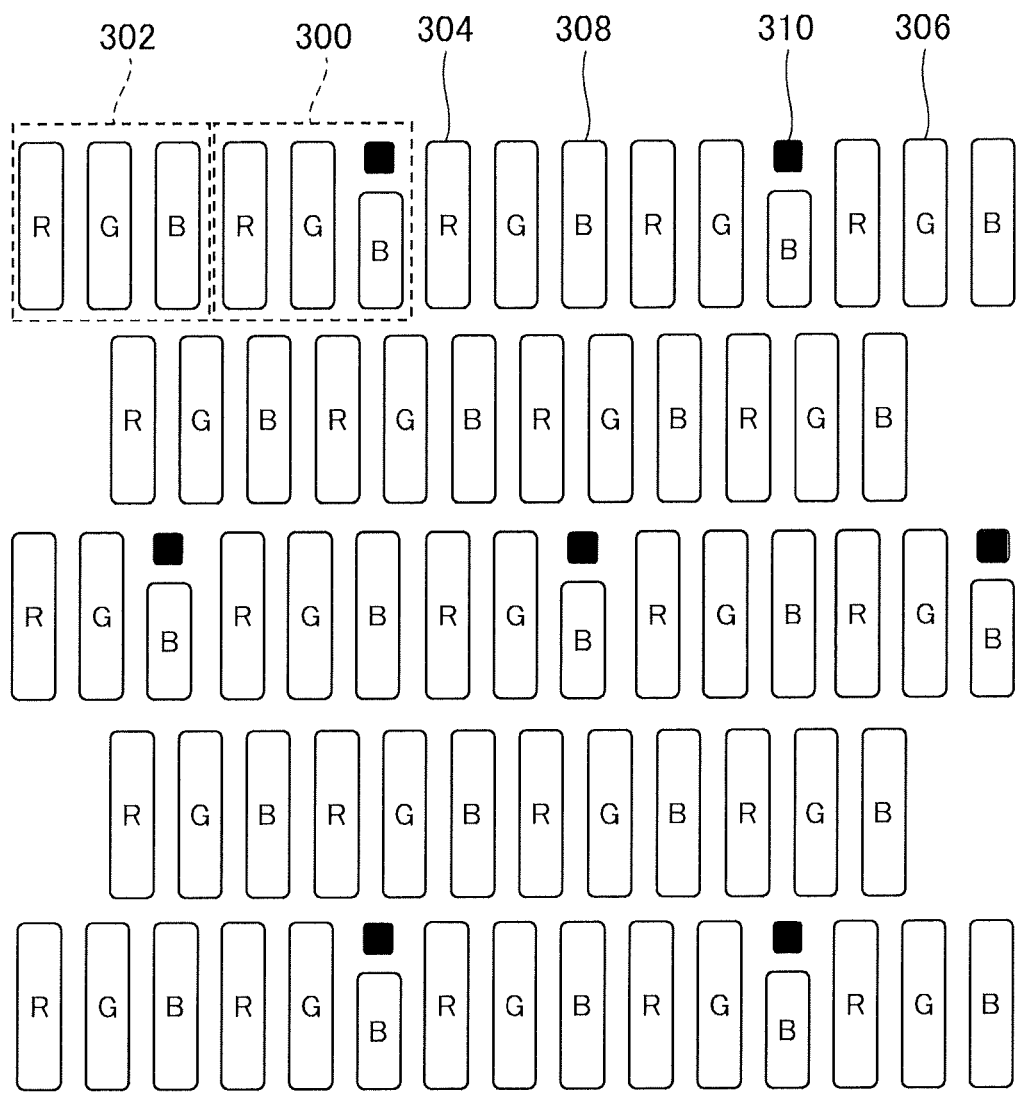
FIG. 5 is a schematic diagram illustrating an example of a pixel layout in the second embodiment.

FIG. 5 is a schematic diagram illustrating an example of a pixel layout in the display area 202 in the second embodiment.

In the second embodiment, the pixels are respectively disposed in the first direction and the second direction perpendicular to the first direction. Similarly to the first embodiment, each pixel includes a red sub-pixel, a green sub-pixel, and a blue sub-pixel disposed in this order from left to right in FIG. 5.

Each of the pixels arranged n-th position in the second direction is displaced by ½ a width of the pixel in the first direction from each of the pixels arranged n+1-th position in the second direction. Specifically, as shown in FIG. 5, the pixels arranged n-th position in the column direction (downward direction in FIG. 5) disposed in the row direction (rightward direction in FIG. 5) are shifted by a half a width of a pixel in the row direction from the n+1 pixels in the column direction disposed in the row direction. For example, the pixels in the first row and the pixels in the second row are shifted by a half a width of a pixel in the row direction.

The pixels arranged n-th position in the second direction include the first pixels 300 and the second pixels 302 that are alternately disposed in the first direction. Specifically, the pixels arranged n-th position in the column direction include the first pixels 300 and the second pixels 302 that are alternately disposed in the row direction. For example, in FIG. 5, the pixels disposed in first, third, and fifth rows include the first pixels 300, which are provided with the spacers 310, and the second pixels 302, which are not provided with the spacer 310, that are alternately disposed in the row direction.

Further, the pixels arranged n+1-th position in the second direction include the second pixels 302 disposed in the first direction. Specifically, the pixels arranged n+1-th position in the column direction include the second pixels 302 disposed in the row direction. For example, in FIG. 5, the pixels disposed in second and fourth rows include the second pixels 302 that are not provided with the spacer 310 and disposed in the row direction.

As described above, in the pixel layout of the second embodiment as well, it is possible to reduce deterioration of display quality due to the spacer by disposing the spacer 310 in the blue light emitting area having less effect on visibility.

[Third Embodiment]

Figure 6:
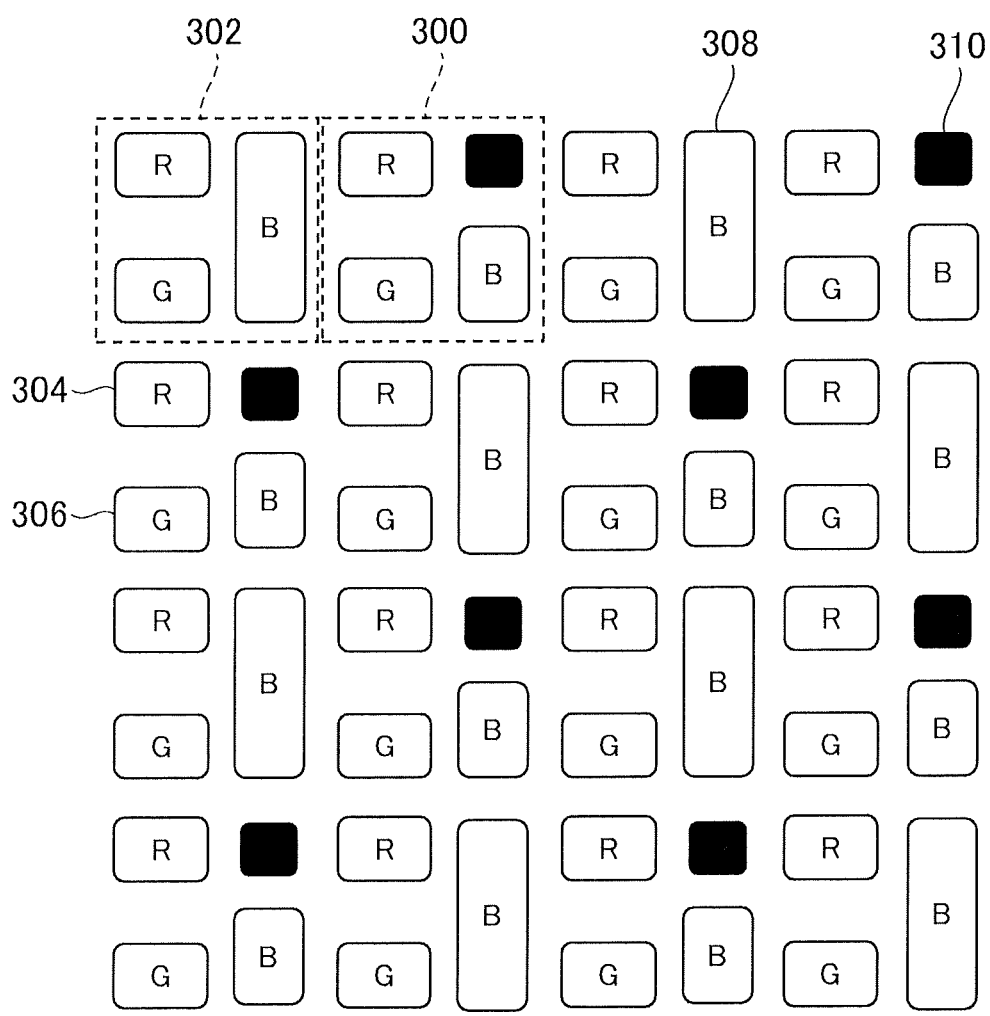
FIG. 6 is a schematic diagram illustrating an example of a pixel layout in the third embodiment.
Figure 7A:
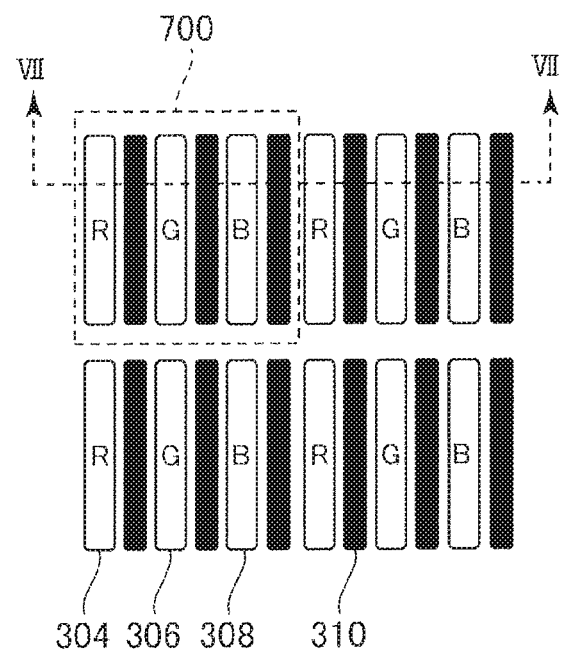
FIG. 7A is a diagram illustrating a relationship between a vapor deposition mask and a spacer in the conventional technique.
Figure 7B:
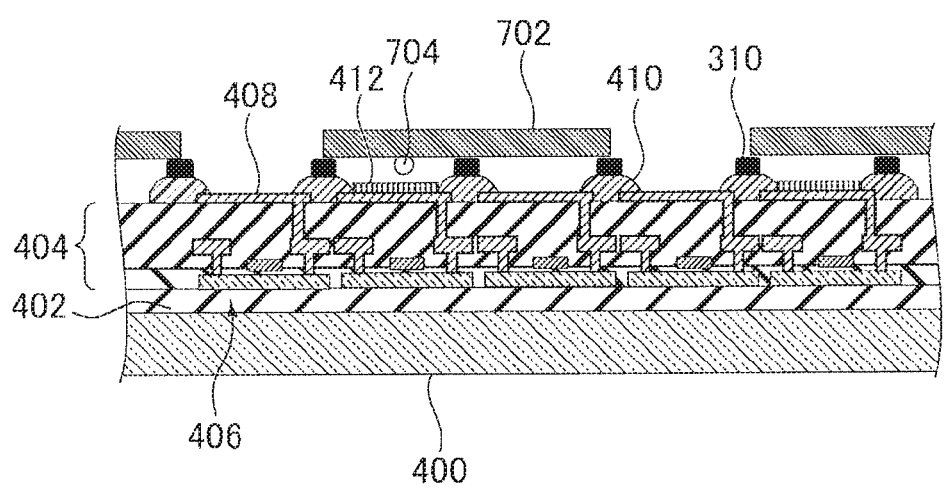
FIG. 7B is a diagram illustrating a relationship between a vapor deposition mask and a spacer in the conventional technique.

FIG. 6 is a schematic diagram illustrating an example of a pixel layout in the display area 202 according to the third embodiment. In the third embodiment, the pixels are respectively disposed in the first direction and the second direction perpendicular to the first direction.

The first pixels 300 and the second pixels 302 are alternately disposed in the first direction and the second direction. Specifically, the first pixels 300 that are provided with the spacers 310 and the second pixels 302 that are not provided with the spacer 310 are alternately disposed in the row direction (rightward direction in FIG. 6) and in the column direction (downward direction in FIG. 6).

In each pixel, a blue sub-pixel is disposed in the first direction side of a red sub-pixel and a green sub-pixel, and the green sub-pixel is disposed in the second direction side of the red sub-pixel. Specifically, in the first pixels 300 and the second pixels 302, the blue light emitting area 308 included in the blue sub-pixel is disposed in the row direction of the red light emitting area 304 included in the red-sub-pixel and the green light emitting area 306 included in the green sub-pixel.

In the first pixel, the blue sub-pixel is disposed in the second direction side of the spacer 310. Specifically, in the first pixel, the blue light emitting area 308 included in the blue sub-pixel is disposed in the column direction side of the spacer 310, that is, in the lower right of the pixel. The spacer 310 may be disposed in the second direction side of the blue sub-pixel. In this case, the blue light emitting area 308 included in the blue sub-pixel is disposed in the upper right of the pixel.

Each of the blue light emitting areas 308 included in the first pixels 300 and the second pixels 302 is formed larger than the red light emitting area 304 and the green light emitting area 306. Specifically, the red sub-pixel included in the first pixel 300 is disposed in the upper left of the pixel, and the green sub-pixel is disposed in the lower left of the pixel.

The blue sub-pixel is formed in the right side of the pixel, and about twice as large as the red sub-pixel and the green sub-pixel. As such, the blue light emitting area included in the second pixel 302 is formed about twice as large as the red light emitting area 304 and the green light emitting area 306.

Similarly to the second pixel 302, the blue light emitting area 308 included in the first pixel 300 is also formed larger than the red light emitting area 304 and the green light emitting area 306. In contrast, the blue light emitting area 308 included in the first pixel 300 is formed smaller than the blue light emitting area 308 included in the second pixel 302 by the size of the spacer 310.

As described above, in the pixel layout of the third embodiment as well, it is possible to reduce deterioration of display quality due to the spacer by disposing the spacer 310 in the blue light emitting area having less effect on visibility.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An EL display device, comprising:
   first pixels arranged in a first matrix form, each of the first pixels including,
      a first red sub-pixel including a first red light element emitting red light,
      a first green sub-pixel including a first green light element emitting green light, and
      a first blue sub-pixel including a first blue light element emitting blue light;
   second pixels arranged in a second matrix form, each of the second pixels including
      a second red sub-pixel including a second red light emitting element emitting red light,
      a second green sub-pixel including a second green light emitting element emitting green light,
      a second blue sub-pixel including a second blue light emitting element emitting blue light, and
      a spacer;
   wherein a first area of the first blue light emitting element is larger than a second area of the second blue light emitting element; and
   wherein the first area is larger than a total area of the second area and a third area of the spacer.

2. The EL display device according to claim 1, wherein a first total number of the first pixels is larger than a second total number of the second pixels.

3. The EL display device according to claim 2, wherein the second matrix form is a zigzag arrangement.

4. The EL display device according to claim 1, wherein the first area is larger than a fourth area of the first red light emitting element,
   the first area is larger than a fifth area of the first green light emitting element, the first area is larger than a sixth area of the second red light emitting element, and the first area is larger than a seventh area of the second green light emitting element.

5. The EL display device according to claim 4, wherein the second area is larger than the fourth area, the second area is larger than the fifth area, the second area is larger than the sixth area, and the second area is larger than the seventh area.

\* \* \* \* \*